(12) United States Patent
Venezia et al.

(10) Patent No.: US 7,238,625 B2
(45) Date of Patent: Jul. 3, 2007

(54) METHOD FOR PROCESSING A SEMICONDUCTOR DEVICE COMPRISING A SILICON-OXY-NITRIDE DIELECTRIC LAYER

(75) Inventors: Vincent Charles Venezia, Sunnyvale, CA (US); Florence Nathalie Cubaynes, Tournefeuille (FR)

(73) Assignees: Interuniversitair Microelektronika Centrum (IMEC), Leuven (BE); Koninklijke Philips Electronics N.V., Eindhoven (NL)

( * ) Notice: Subject to any disclaimer, the term of this patent is extended or adjusted under 35 U.S.C. 154(b) by 69 days.

(21) Appl. No.: 10/966,153

(22) Filed: Oct. 15, 2004

(65) Prior Publication Data

US 2005/0130377 A1 Jun. 16, 2005

(30) Foreign Application Priority Data

Oct. 17, 2003 (EP) .................................. 03447258

(51) Int. Cl.
*H01L 21/31* (2006.01)
*H01L 21/469* (2006.01)

(52) U.S. Cl. ...................... 438/770; 438/775; 438/786; 438/787; 257/E21.193; 257/E21.284

(58) Field of Classification Search ................ 438/770, 438/775, 786, 787; 257/E21.193, E21.284
See application file for complete search history.

(56) References Cited

U.S. PATENT DOCUMENTS 6,521,912 B1 2/2003 Sakama et al.

2003/0001218 A1 1/2003 Takagi

FOREIGN PATENT DOCUMENTS

EP 0 399 737 A1 11/1990

OTHER PUBLICATIONS

European Search Report for Application No. EP 03 44 7258 mailed Mar. 5, 2004.
Nanjo, Junji, et al. *Composition Analysis of Anodic SiO2/Si Interface Region Using the XPS Method*, Electronics and Communications in Japan, Part 2, vol. 76, No. 6, 1993, pp. 99-106, Scripta Technica, Inc.
Sigmon, T.W. *Stoichiometry of thin silicon oxide layers on silicon*, Applied Physics Letters, vol. 24, No. 3, 1974, pp. 105-107, American Institute of Physics.

Primary Examiner—Fernando L. Toledo
(74) Attorney, Agent, or Firm—Knobbe Martens Olson & Bear LLP

(57) ABSTRACT

The present invention provides a method for processing a semiconductor device wherein a dielectric layer is partially converted into a silicon-oxy-nitride by incorporation of nitrogen atoms into the dielectric layer, which comprises a silicon oxide. Before the introduction of the nitrogen atoms into the dielectric layer, the dielectric layer is provided as a silicon oxide in which the atomic silicon to oxygen ration is greater than ½. In this way, MOS transistors are obtained with a high quality interface between the dielectric region and semiconductor substrate, and a dielectric region which is impermeable to impurity atoms from the gate region and which has a thickness which is substantially equal to the dielectric layer as deposited.

19 Claims, 3 Drawing Sheets

METHOD FOR PROCESSING A SEMICONDUCTOR DEVICE COMPRISING A SILICON-OXY-NITRIDE DIELECTRIC LAYER

FIELD OF THE INVENTION

The present invention relates to a semiconductor device comprising an insulating layer of silicon-oxy-nitride material, and to a method of manufacturing such a semiconductor device.

BACKGROUND OF THE INVENTION

Gate dielectric thickness in, for example, CMOS technology is continually scaled down with each technology node. For instance, sub 100 nm CMOS (Complementary MOS) technology requires a gate dielectric, assuming a doped silicon dioxide ($SiO_2$) layer with a layer thickness below 1.5 nm. However, reducing the $SiO_2$ thickness below 3 nm has resulted in such deleterious effects as penetration of dopant atoms of the polysilicon gate, such as, for example, boron, and hence an unacceptable increase in gate tunneling current (gate leakage). This effect has become a significant limitation in CMOS downscaling as this is paired with an increasingly thin dielectric region being required. The addition of nitrogen (N) to the dielectric layer in order to form a dielectric layer of a silicon-oxy-nitride is very beneficial in this respect, because dopant atoms of a polysilicon gate, such as, for example, boron, are better stopped by such a dielectric layer. It has also been shown that increasing the amount of nitrogen in a $SiO_2$ film results in an increased dielectric constant, which is between the dielectric constant of the pure oxide and silicon nitride. An increased dielectric constant makes it possible to create physically thicker films for a given electrical thickness, thereby reducing the gate leakage current. These features have extended the scalability of silicon dioxide to sub 100 nm technologies. Therefore, there is currently a drive to create a process that can successfully incorporate a large concentration of N in $SiO_2$.

A method for incorporating nitride into a silicon oxide layer is described in U.S. Publ. No. 2003/0001218, which teaches a dielectric layer comprising a thermal silicon oxide that is provided with nitrogen atoms. The dielectric layer is made by thermal oxidation in a $N_2/O_2$ mixture ambient. The incorporation of nitrogen atoms is done by treatment of the dielectric layer in an ambient containing NO and a limited amount of oxygen. In this way, during the silicon-oxy-nitride formation, the peak of the nitrogen concentration is kept a very short distance away from the interface between the dielectric layer and the semiconductor body of silicon. In this way, the quality of the interface, and thus the device quality, is improved.

A drawback of the method described above is that the beneficial effect of the incorporation of nitrogen into the dielectric layer is still not satisfactory for very thin dielectric layers. Gate leakage may still occur in such cases. This drawback grows in importance as dielectric layers become thinner.

SUMMARY OF THE INVENTION

It is an object of the present invention to avoid the above drawbacks and to provide a method for processing a semiconductor device comprising a silicon-oxy-nitride dielectric layer that is very thin and that reduces the gate leakage current in the device, wherein the method is simple and well controllable.

The above objective is accomplished by methods and devices according to the preferred embodiments.

In a first embodiment, a method is provided for processing a semiconductor device comprising a silicon oxide control electrode dielectric layer and a control electrode, the method comprising providing a silicon oxide control electrode dielectric layer on a semiconductor substrate before the formation of a control electrode on top of the control electrode dielectric layer, and after providing the control electrode dielectric layer, at least partially converting it into a silicon-oxy-nitride layer incorporating nitrogen atoms into the silicon oxide control electrode dielectric layer. The silicon oxide control electrode dielectric layer as provided before the introduction of the nitrogen atoms therein can have an atomic silicon to oxygen ratio that is larger than ½.

In an aspect of the first embodiment, providing the silicon oxide dielectric layer comprises providing a first or a lower region, positioned close to an interface between the semiconductor substrate and the silicon oxide control electrode dielectric layer and having an atomic silicon to oxygen ratio substantially equal to ½, and providing a second or upper region, positioned close to a surface of the silicon oxide control electrode dielectric layer (will be the interface between the dielectric layer and the control electrode) and having an atomic silicon to oxygen ration larger than ½. The nitrogen atoms are more selectively incorporated in the second region of the dielectric layer. The atomic silicon to oxygen ratio in the silicon oxide dielectric layer can decrease gradually or step-wise from a value larger than ½ towards a value substantially equal to ½ when going from the second or upper region towards the first or lower region.

In an aspect of the first embodiment, providing a silicon oxide control electrode dielectric layer comprises providing a silicon oxide control electrode dielectric layer with an atomic silicon to oxygen ratio substantially equal to ½ and subsequently incorporating additional silicon atoms into the formed silicon oxide control electrode dielectric layer, e.g., by implantation. This step is particularly suitable for use with a thermal silicon oxide, in that it provides the highest quality both with respect to the interface with silicon as well as with respect to defect density. It is also very easy to form. The silicon atoms can be incorporated into the silicon dioxide layer by either ion implantation or by plasma implantation.

In an aspect of the first embodiment, providing a silicon oxide control electrode dielectric layer can be performed by thermal oxidation of a silicon substrate, onto which the silicon oxide dielectric layer is formed.

The silicon oxide dielectric layer can be provided by a deposition technique such as, for example, chemical vapor deposition (CVD), which is generally preferred as it is more suitable for the large-scale production of MOS ICs. Other suitable deposition techniques include sputtering, plasma enhanced CVD (PECVD), and atomic layer deposition (ALD). In this way, it is very simple to introduce a stepwise or gradual profile in the atomic silicon to oxygen ratio in the dielectric layer.

Incorporation of nitrogen atoms into the silicon oxide control electrode dielectric layer can be performed using a nitrogen plasma. An annealing step in an ambient comprising a gaseous compound of nitrogen, such as $N_2$ or NO or the like, is however, also possible.

In a second embodiment, a device is provided comprising a control electrode dielectric layer provided between a semiconductor substrate and a control electrode. The control electrode dielectric layer is at least partially a silicon-oxy-nitride layer. The control electrode dielectric layer comprises a first region, positioned close to an interface between the semiconductor substrate and the control electrode dielectric layer and having an atomic silicon to oxygen ratio substantially equal to ½ and a second region, positioned close to a surface of the control electrode dielectric layer and having an atomic silicon to oxygen ratio larger than ½. The control electrode dielectric layer can be at least partially converted into a silicon-oxy-nitride layer by a method as in the first embodiment.

In an aspect of the second embodiment, the semiconductor substrate is a silicon substrate.

The semiconductor device can be a transistor device, for example, a field effect transistor, having a first main electrode region, e.g., source region, and a second main electrode region, e.g., drain region, at a surface of the semiconductor substrate. A control electrode, e.g., gate region, is provided between the first and second main electrode regions, and is separated from the surface of the semiconductor substrate by a control electrode dielectric. Before formation of the control electrode, a control electrode dielectric layer of silicon oxide is formed on the surface of the semiconductor substrate, wherein the dielectric layer is at least partially converted into a silicon-oxy-nitride by incorporation of nitrogen atoms into the dielectric layer of silicon oxide. The control electrode dielectric is made in accordance with the preferred embodiments. Such a method is very suitable for making MOSFET (Metal Oxide Semiconductor Field Effect Transistor) devices.

An advantage of the methods of the preferred embodiments is that it becomes possible to form very thin dielectric layers, through which gate leakage can be reduced or suppressed.

Semiconductor devices according to the preferred embodiments offer the important advantage of a well controlled and very thin dielectric layer, e.g., of less than 1.5 nm, the latter being required for sub 100 nm CMOS technology, and a high quality interface between dielectric region and semiconductor substrate, e.g., silicon semiconductor substrate.

These and other characteristics, features and advantages of the preferred embodiments will become apparent from the following detailed description, taken in conjunction with the accompanying drawings, which illustrate, by way of example, the principles of the preferred embodiments. This description is given for the sake of example only, without limiting the scope of the invention. The reference figures quoted below refer to the attached drawings.

In a first aspect, a method for processing a semiconductor device comprising a silicon oxide control electrode dielectric layer and a control electrode is provided, the method comprising forming a control electrode dielectric layer on a semiconductor substrate, the control electrode dielectric layer comprising a silicon oxide, wherein at least a portion of the silicon oxide has an atomic silicon to oxygen ratio that is greater than 0.5; converting a portion of the control electrode dielectric layer into a silicon-oxy-nitride layer by incorporating nitrogen atoms into the control electrode dielectric layer; and thereafter forming the control electrode on top of the control electrode dielectric layer. The step of forming the control electrode dielectric layer comprises forming a first region of the control electrode dielectric layer, wherein the first region is positioned adjacent to an interface between the semiconductor substrate and the control electrode dielectric layer, and wherein the first region has an atomic silicon to oxygen ratio substantially equal to ½; and forming a second region of the control electrode dielectric layer, wherein the second region is positioned adjacent to a surface of the control electrode dielectric layer, wherein the second region has an atomic silicon to oxygen ratio larger than ½.

In an embodiment of the first aspect, an atomic silicon to oxygen ratio in the control electrode dielectric layer gradually decreases from the second region towards the first region, from a value greater than ½ to a value substantially equal to ½.

In an embodiment of the first aspect, forming a control electrode dielectric layer further comprises forming a third region of the control electrode dielectric layer with an atomic silicon to oxygen ratio substantially equal to ½ atop the control electrode dielectric layer; and incorporating additional silicon atoms into the control electrode dielectric layer by implantation.

In an embodiment of the first aspect, forming a control electrode dielectric layer further comprises forming a third region of the control electrode dielectric layer with an atomic silicon to oxygen ratio substantially equal to ½, and incorporating additional silicon atoms into the control electrode dielectric layer by implantation.

In an embodiment of the first aspect, the substrate comprises silicon, and wherein forming a control electrode dielectric layer comprises performing a thermal oxidation of the substrate.

In an embodiment of the first aspect, forming a control electrode dielectric layer comprises performing a deposition.

In an embodiment of the first aspect, forming a control electrode dielectric layer comprises performing a chemical vapor deposition.

In an embodiment of the first aspect, incorporating nitrogen atoms in the control electrode dielectric layer is performed using a nitrogen plasma.

In a second aspect, a semiconductor device comprising a control electrode and a control electrode dielectric layer on a semiconductor substrate, wherein the control electrode dielectric layer is at least partially a silicon-oxy-nitride layer is provided, wherein the control electrode dielectric layer comprises a first region, wherein the first region is positioned adjacent to an interface between the semiconductor substrate and the control electrode dielectric layer, wherein the first region has an atomic silicon to oxygen ratio substantially equal to ½; and a second region, wherein the second region is positioned adjacent to a surface of the control electrode dielectric layer, wherein the second region has an atomic silicon to oxygen ratio greater than ½.

In an embodiment of the second aspect, the semiconductor substrate comprises silicon.

In an embodiment of the second aspect, the semiconductor device comprises a transistor device.

In an embodiment of the second aspect, the silicon-oxy-nitride layer is situated in the second region.

Figure 1:
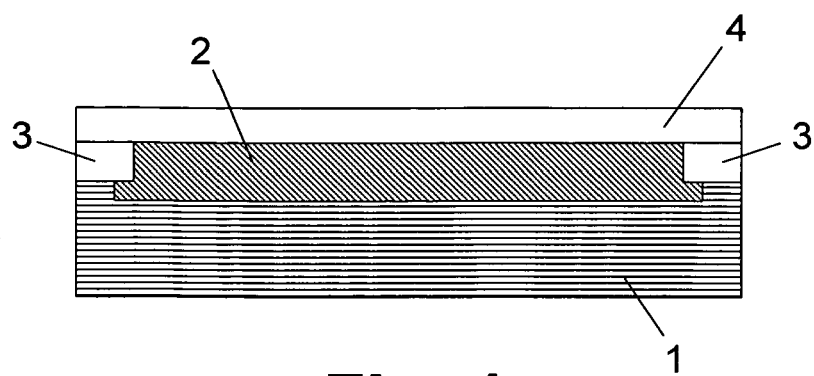
FIGS. 1 through 8 show sectional views of a semiconductor device at various stages in the manufacture of the device according to a method of a preferred embodiment.

In the different figures, the same reference signs refer to the same or analogous elements.

DETAILED DESCRIPTION OF THE PREFERRED EMBODIMENT

The following description and examples illustrate a preferred embodiment of the present invention in detail. Those of skill in the art will recognize that there are numerous variations and modifications of this invention that are encompassed by its scope. Accordingly, the description of a preferred embodiment should not be deemed to limit the scope of the present invention.

The drawings described are only schematic and are non-limiting. In the drawings, the size of some of the elements may be exaggerated and not drawn on scale for illustrative purposes. In particular, the dimensions in the thickness direction are exaggerated for greater clarity.

Furthermore, the terms first, second, third, and the like in the description and in the claims are used for distinguishing between similar elements and not necessarily for describing a sequential or chronological order. It is to be understood that the terms so used are interchangeable under appropriate circumstances and that the preferred embodiments described herein are capable of operation in other sequences than described or illustrated herein.

Moreover, the terms top, bottom, over, under, and the like in the description and the claims are used for descriptive purposes and not necessarily for describing relative positions. It is to be understood that the terms so used are interchangeable under appropriate circumstances and that the preferred embodiments described herein are capable of operation in other orientations than described or illustrated herein.

The manufacture of a device by a method according to the preferred embodiments is illustrated in FIGS. 1 to 8, which each show sectional views of a semiconductor device at various stages in the manufacturing process. The method can be used in fabricating semiconductor devices comprising insulated control electrodes, for example, gates, and at least two main electrodes, for example, a source and a drain electrode.

In the description hereinafter, a method is described for the manufacturing of a device 20 having a gate as control electrode and a source and a drain as first and second main electrodes. This example is used only for ease of explanation and is not intended to be limiting.

The manufacturing process of a PMOST (p-channel MOS transistor) device 20 of a preferred embodiment is described. The device 20 may comprise a semiconductor substrate 1 of a first conductivity type which, in this embodiment, is made of silicon but which can alternatively be made of any other suitable semiconductor material. The starting point for the manufacture of the device 20 according to this embodiment is a substrate 1 of a first conductivity type, for example a p-type silicon substrate 1 in which a well 2 of a second conductivity type, for example an n-type well 2 is formed (FIG. 1). In the semiconductor substrate 1, isolation regions or trenches 3 of, for example, silicon dioxide are formed. Subsequently, on the surface of the silicon substrate 1, a control electrode dielectric such as gate dielectric 4 of a silicon oxide is formed. The gate dielectric 4 can have a thickness of, for example, 1 nm. In this embodiment, the gate dielectric 4 is deposited on top of the silicon substrate 1 by CVD (Chemical Vapor Deposition) at a temperature of, for example, 700° C. However, other suitable deposition techniques can be used as well. Particular suitable alternative techniques which can be used for the deposition of the gate dielectric 4 are sputtering, PECVD (Plasma Enhanced CVD), or ALD (Atomic Layer Deposition). The latter technique is generally preferred for deposition of very thin gate dielectric layers 4.

In a first or lower region of this gate dielectric 4, which is close to the interface between the semiconductor substrate 1 and the dielectric layer 4, the composition and growth conditions are chosen such that the deposited material has a composition which is substantially equal to that of silicon dioxide, i.e. the atomic ratio Si/O is substantially equal to ½. In a second or upper region of the gate dielectric 4, which is more remote from the interface between the gate dielectric 4 and the semiconductor substrate 1 below the dielectric 4, and hence is closer to the free surface of the dielectric layer 4, the composition is changed gradually or stepwise towards a material which has an atomic ratio Si/O which is larger than ½, for example, such as that of a material of which the composition corresponds to $Si_2O_3$ and thus a material of which the atomic silicon to oxygen ratio is 2/3 (=1/1.5). In this way, full advantage is taken of the high interfacial quality of a stoichiometric silicon dioxide, such as a thermal silicon oxide and the semiconductor body of, e.g., silicon. The nitrogen atoms are more selectively incorporated in the upper part of the dielectric layer 4, which is more remote from the interface between the semiconductor substrate 1 and the dielectric layer 4. In this way, in the methods of the preferred embodiments, it is possible to incorporate nitrogen atoms into the gate dielectric 4 without an unwanted increase of thickness of the gate dielectric 4, which would otherwise occur.

This is particularly advantageous if the gate dielectric 4 is to be 5 nm thick or less. For, e.g., future sub 100 nm device technologies, a gate dielectric 4 that is electrically thinner than 1.5 nm is desired or even necessary. The growth conditions are preferably chosen such that the growth rate is very small such that the total growth time of the gate dielectric 4 is at least several seconds and such that the composition can be changed during the growth/deposition of the gate dielectric 4.

In an advantageous modification of this embodiment, the atomic silicon to oxygen ratio is gradually or stepwise decreased from more than ½ to ½, going from the upper region of the dielectric layer 4 towards the interface with the semiconductor substrate 1.

Figure 2:
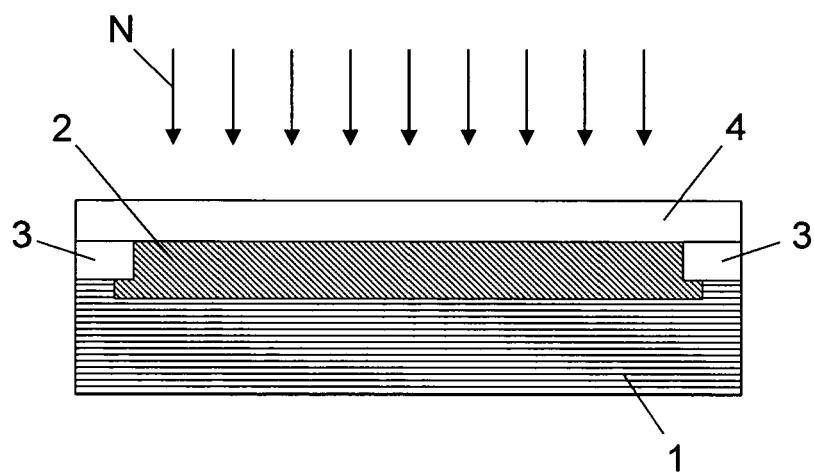

After deposition, the gate dielectric 4 is transformed into a material which is a silicon-oxy-nitride by incorporation of nitrogen atoms N into the gate dielectric 4 (FIG. 2). In this embodiment, this can be done by exposing the semiconductor substrate 1 to a nitrogen plasma. As explained above, this transformation gives a more efficient incorporation of nitrogen into the silicon oxide layer 4.

In the methods of the preferred embodiments, the introduction of nitrogen atoms in a thermal silicon oxide, which is a substantially stoichiometric silicon dioxide, releases oxygen atoms as a part of the oxygen ions are replaced by nitrogen atoms. Free silicon bonds are available and thus there is less need to replace oxygen atoms by nitrogen atoms in order to form silicon-nitrogen bonds. Thus, a much more efficient incorporation of nitrogen atoms into the silicon oxide is obtained with respect to conventional methods. Hence, this allows the use of thinner dielectric layers than in conventional methods.

Moreover, the oxygen atoms which are released if an oxygen atom is replaced by a nitrogen atom can diffuse to the interface between the silicon and the dielectric layer 4, where they can react with silicon that is partly incorporated into the dielectric layer 4, such that the thickness of the layer can increase. The addition of an oxidizing agent such as $O_2$ in conventional methods further increases this problem. The methods according to the preferred embodiments suffer less from this problem as less oxygen is released when nitrogen is incorporated. Insofar as this does occur, oxygen atoms meet unbound silicon atoms in their direct environment. Thus, they do not diffuse to the interface between the silicon semiconductor substrate 1 and the dielectric layer 4 where they can be consumed by the silicon thereof, leading to an increased thickness of the dielectric layer 4.

Figure 3:
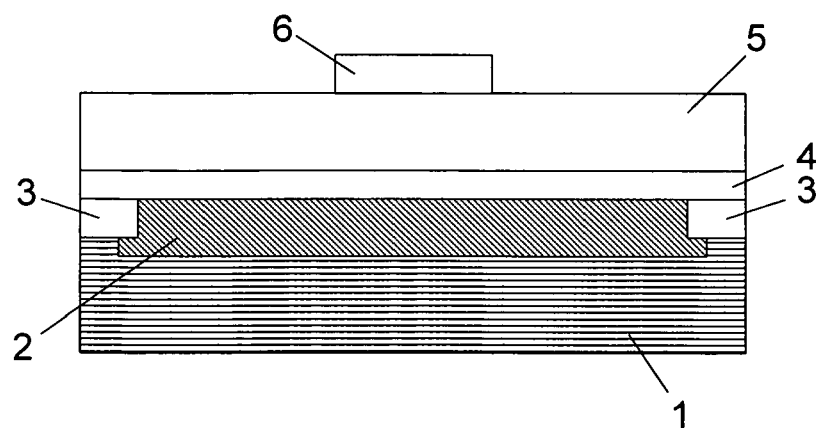

In a next step, a polycrystalline silicon layer 5 is deposited onto the gate dielectric layer 4 by a method such as CVD. The polycrystalline silicon layer 5 can have a thickness of, for example, 100 nm. A mask 6 can then be deposited on top of the structure at the area where later the gate 7 is formed. The mask 6 can, for example, comprise a resist and can be formed by standard photolithography. This step is illustrated in FIG. 3.

Figure 4:
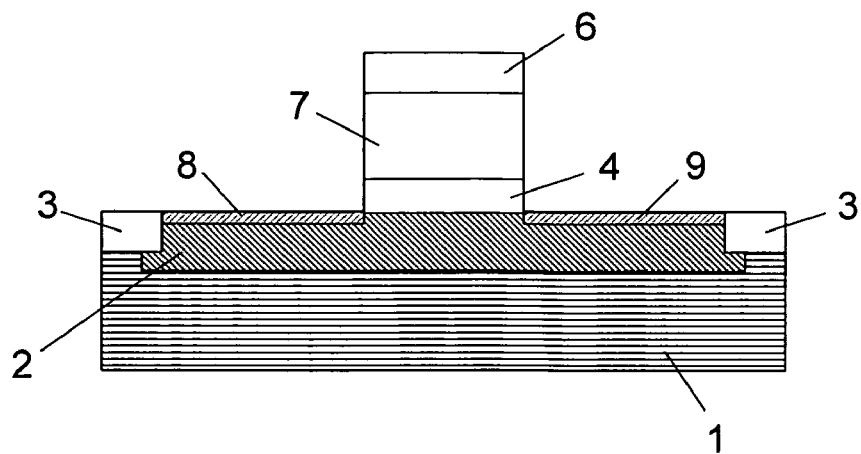

Outside the mask 6, the layers 4 and 5 are removed by any suitable removal technique, for example, by etching. In this way, a gate stack, comprising a gate 7 and a gate dielectric 4, can be formed (FIG. 4). The thickness of the gate stack is, in this embodiment, 101 nm (gate 7+dielectric 4) and corresponds to the height in a standard CMOS process for 100 nm devices. With the gate stack as a mask, shallow p-type implantations can be performed to form the LDD (Lightly Doped Drain) extensions 8, 9 of the source and drain regions 10, 11 of the device 20 to be formed.

Figure 5:
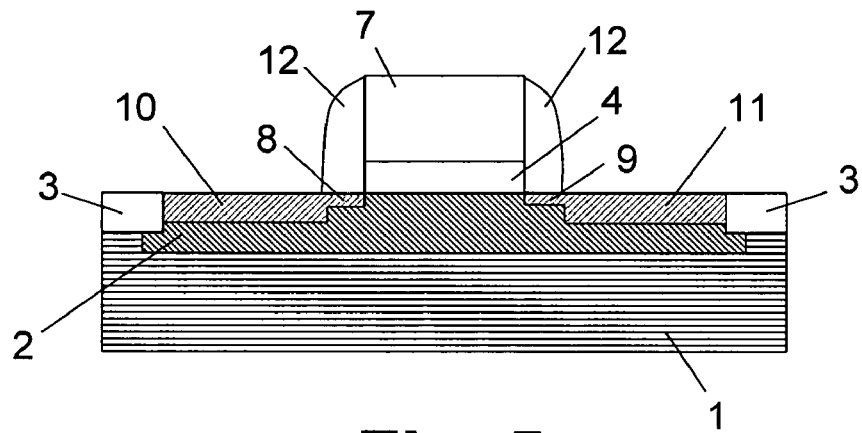

Subsequently, insulating spacers 12 are formed at both sides of the gate stack above the LDD extensions 8, 9, for example, by depositing a uniform layer of a suitable dielectric material, such as, for example, silicon dioxide, on the existing structure, followed by anisotropic etching of the deposited layer such that it is removed in the planar regions of the device, resulting in insulating spacers 12 as illustrated in FIG. 5. The thickness of the deposited dielectric material can, for example, be between 90 and 100 nm, and the width of the spacers 12 formed can be about the same, but the preferred embodiments are not limited to this example.

Next, deeper p+ type implantations are performed in order to complete source and drain 10, 11 formation. The semiconductor substrate 1 is then annealed at a temperature of, for example, above 1000° C. in order to activate the source and drain 10, 11 implantations.

In another embodiment, the source and drain extensions 8, 9 can advantageously be made after formation and annealing of the deeper parts of source and drain 10, 11 as they can be annealed at a lower temperature than is employed for annealing the deeper parts. The insulating spacers 12 then are removed before making the extensions 8, 9 and new insulating spacers are to be formed after formation of the extensions 8, 9.

Figure 6:
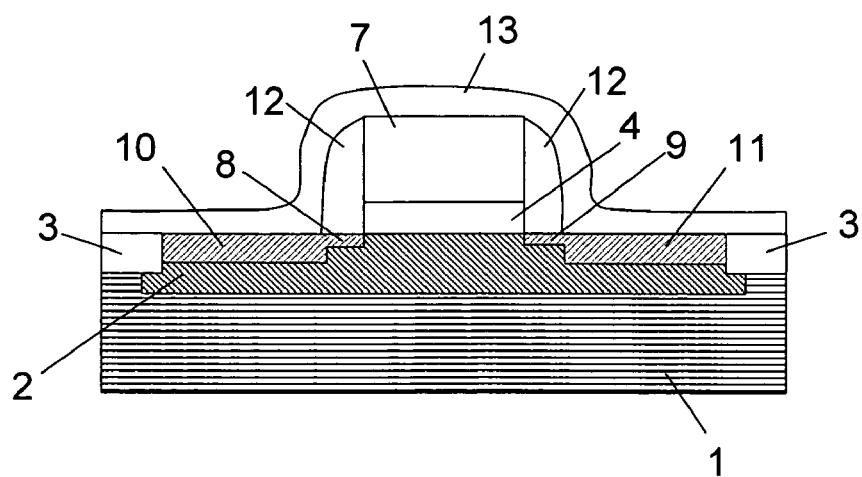

In a next step, which is illustrated in FIG. 6, a metal layer 13 is deposited over the structure. The metal layer 13 can comprise a stack of metal layers, for example, it can comprise an 8 nm thick cobalt layer with a 10 nm thick titanium layer on top. Other combinations of metal layers can also be used. As discussed further below, and while not wishing to be bound by any particular theory, it is believed that the titanium layer prevents shorts after silicidation and acts as a barrier for oxygen.

Figure 7:
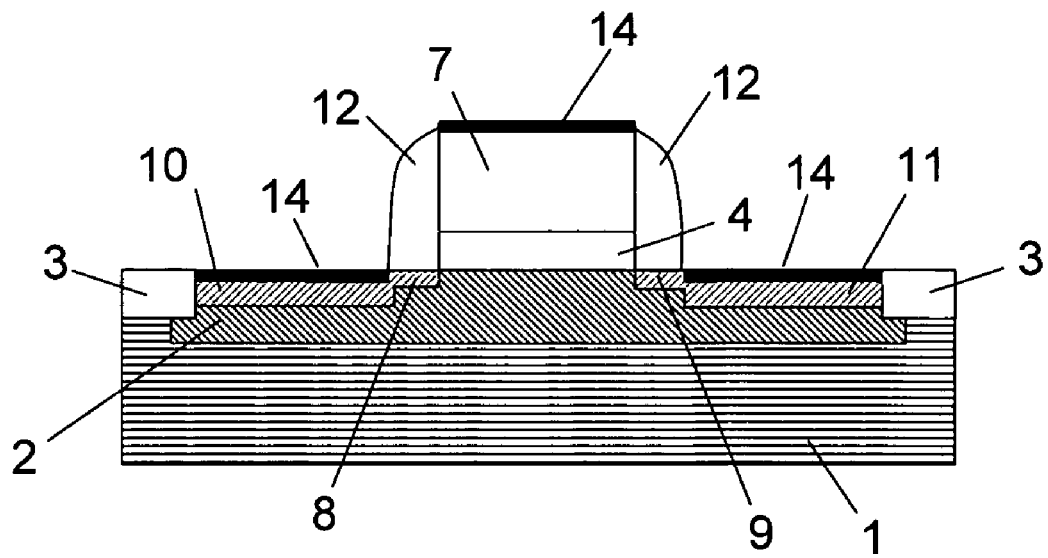
Figure 8:
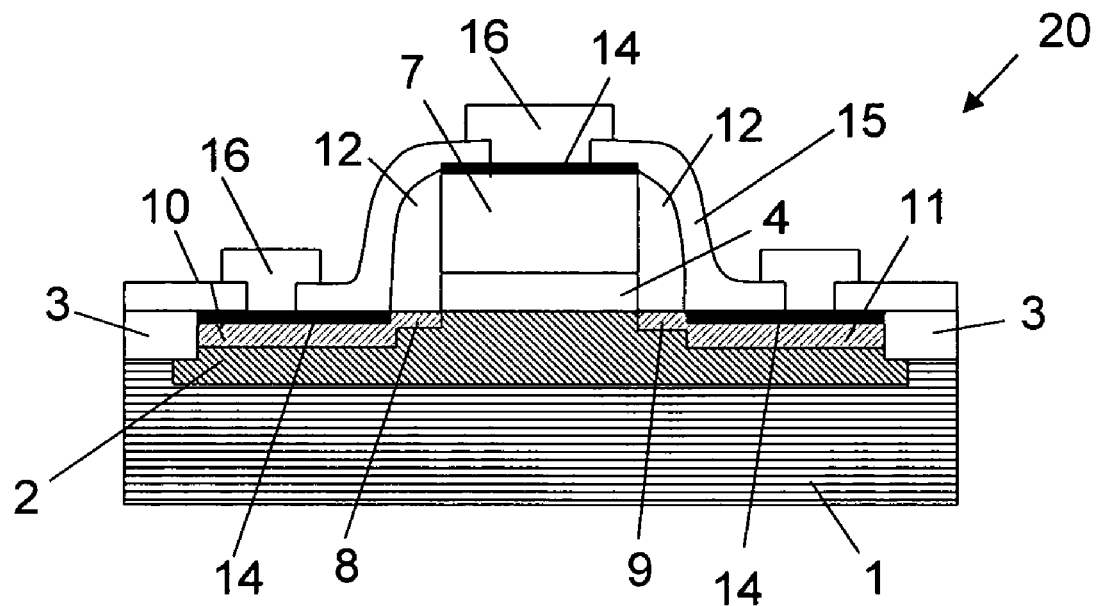

Subsequently, the device 20 is thermally treated in order to form silicided regions 14, i.e., alloys of silicon and metal, on the gate 7 and on the source 10 and drain 11 (FIG. 7). Formation of silicided regions 14 can be performed by, for example, using two heating steps. In a first heating step, wherein the temperature is from about 400 to about 600° C., for example 540° C., the cobalt layer turns into CoSi. Next, the unreacted titanium and the unreacted cobalt are removed, for example, by etching. In a second heating step, the temperature is from about 600 to about 900° C., for example 850° C. In this step, the CoSi formed in regions 14 is converted into $CoSi_2$. The regions 14 now have a suitable thickness, and the gate 7 becomes a fully silicided region. Hence, a depletion layer effect in the gate 7 is avoided.

Finally, the manufacturing of the p-MOSFET device 20 can be completed by deposition of a pre-metal dielectric 15, such as, for example, silicon dioxide, followed by patterning of the pre-metal dielectric 15. Deposition of a contact metal layer, such as, for example, aluminum, followed by patterning results in the formation of contact regions 16 (see FIG. 8).

In another embodiment, a modification of the first embodiment is described. The gate dielectric layer 4 (see FIG. 2) is formed by a thermal oxidation of the silicon of the semiconductor substrate 1. Before the nitridization, which is shown in FIG. 2, silicon atoms are incorporated into the surface region of the dielectric layer 4 by, for example, ion implantation. This can be accomplished by, for example, implanting through a mask layer (not shown in FIG. 2) in order to limit the penetration depth of the silicon atoms into the gate dielectric 4.

An advantage of the methods of preferred embodiments is that the incorporation of nitrogen into the silicon oxide layer is very efficient. This allows a silicon-oxy-nitride to be made that is more like silicon nitride. Thus, the higher K value thereof results in an electrically thinner dielectric with decreased leakage current and decreased risk of dopants penetration. Furthermore, the risk of an increase of layer thickness during the nitridization can be more limited.

All references cited herein are incorporated herein by reference in their entirety and are hereby made a part of this specification. To the extent publications and patents or patent applications incorporated by reference contradict the disclosure contained in the specification, the specification is intended to supersede and/or take precedence over any such contradictory material.

The term "comprising" as used herein is synonymous with "including," "containing," or "characterized by," and is inclusive or open-ended and does not exclude additional, unrecited elements or method steps.

All numbers expressing quantities of ingredients, reaction conditions, and so forth used in the specification and claims are to be understood as being modified in all instances by the term "about." Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches.

The above description discloses several methods and materials of the present invention. This invention is susceptible to modifications in the methods and materials, as well as alterations in the fabrication methods and equipment. Such modifications will become apparent to those skilled in the art from a consideration of this disclosure or practice of the invention disclosed herein. Consequently, it is not intended that this invention be limited to the specific embodiments disclosed herein, but that it cover all modifications and alternatives coming within the true scope and spirit of the invention.

What is claimed is:

1. A method for processing a semiconductor device comprising a silicon oxide control electrode dielectric layer and a control electrode, the method comprising:

forming a control electrode dielectric layer on a semiconductor substrate, the control electrode dielectric layer comprising a silicon oxide, wherein at least a portion of the silicon oxide has an atomic silicon to oxygen ratio that is greater than 0.5, the step of forming the control electrode dielectric layer comprising:

forming a first region of the control electrode dielectric layer, wherein the first region is positioned adjacent to an interface between the semiconductor substrate and the control electrode dielectric layer, and wherein the first region has an atomic silicon to oxygen ratio substantially equal to $\frac{1}{2}$;

forming a second region of the control electrode dielectric layer, wherein the second region is positioned adjacent to a surface of the control electrode dielectric layer, wherein the second region has an atomic silicon to oxygen ratio larger than ½;

forming a third region of the control electrode dielectric layer with an atomic silicon to oxygen ratio substantially equal to ½ atop the control electrode dielectric layer;

incorporating additional silicon atoms into the control electrode dielectric layer by implantation;

converting a portion of the control electrode dielectric layer into a silicon-oxy-nitride layer by incorporating nitrogen atoms into the control electrode dielectric layer; and thereafter forming the control electrode on top of the control electrode dielectric layer.

2. The method according to claim 1, wherein an atomic silicon to oxygen ratio in the control electrode dielectric layer gradually decreases from the second region towards the first region, from a value greater than ½ to a value substantially equal to ½.

3. The method according to claim 1, wherein the substrate comprises silicon, and wherein forming a control electrode dielectric layer comprises performing a thermal oxidation of the substrate.

4. The method according to claim 1, wherein forming a control electrode dielectric layer comprises performing a deposition.

5. The method according to claim 4, wherein forming a control electrode dielectric layer comprises performing a chemical vapor deposition.

6. The method according to claim 1, wherein incorporating nitrogen atoms in the control electrode dielectric layer is performed using a nitrogen plasma.

7. A method for processing a semiconductor device comprising a silicon oxide control electrode dielectric layer and a control electrode, the method comprising:

forming a control electrode dielectric layer on a semiconductor substrate, the control electrode dielectric layer comprising a silicon oxide, wherein at least a portion of the silicon oxide has an atomic silicon to oxygen ratio that is greater than 0.5, the step of forming the control electrode dielectric layer comprising:

forming a first region of the control electrode dielectric layer, wherein the first region is positioned adjacent to an interface between the semiconductor substrate and the control electrode dielectric layer, and wherein the first region has an atomic silicon to oxygen ratio substantially equal to ½; and forming a second region of the control electrode dielectric layer, wherein the second region is positioned adjacent to a surface of the control electrode dielectric layer, wherein the second region has an atomic silicon to oxygen ratio larger than ½, and wherein an atomic silicon to oxygen ratio in the control electrode dielectric layer gradually decreases from the second region towards the first region, from a value greater than ½ to a value substantially equal to ½;

forming a third region of the control electrode dielectric layer with an atomic silicon to oxygen ratio substantially equal to ½;

incorporating additional silicon atoms into the control electrode dielectric layer by implantation;

converting a portion of the control electrode dielectric layer into a silicon-oxy-nitride layer by incorporating nitrogen atoms into the control electrode dielectric layer; and thereafter forming the control electrode on top of the control electrode dielectric layer.

8. The method according to claim 7, wherein the substrate comprises silicon, and wherein forming a control electrode dielectric layer comprises performing a thermal oxidation of the substrate.

9. The method according to claim 7, wherein forming a control electrode dielectric layer comprises performing a deposition.

10. The method according to claim 9, wherein forming a control electrode dielectric layer comprises performing a chemical vapor deposition.

11. The method according to claim 7, wherein incorporating nitrogen atoms in the control electrode dielectric layer is performed using a nitrogen plasma.

12. A semiconductor device comprising a control electrode on top of a control electrode dielectric layer on a semiconductor substrate, wherein the control electrode dielectric layer is at least partially a silicon-oxy-nitride layer, and wherein the control electrode dielectric layer comprises:

a first region, wherein the first region is positioned adjacent to an interface between the semiconductor substrate and the control electrode dielectric layer, wherein the first region has an atomic silicon to oxygen ratio substantially equal to ½; and a second region, wherein the second region is positioned adjacent to a surface of the control electrode dielectric layer, wherein the second region has an atomic silicon to oxygen ratio greater than ½; and a third region atop the control electrode dielectric layer with an atomic silicon to oxygen ratio substantially equal to ½.

13. A semiconductor device according to claim 12, wherein the semiconductor substrate comprises silicon.

14. A semiconductor device according to claim 12, wherein the semiconductor device comprises a transistor device.

15. A semiconductor device according to claim 12, wherein the silicon-oxy-nitride layer is situated in the second region.

16. A semiconductor device comprising a control electrode on top of a control electrode dielectric layer on a semiconductor substrate, wherein the control electrode dielectric layer is at least partially a silicon-oxy-nitride layer, and wherein the control electrode dielectric layer comprises:

a first region positioned adjacent to an interface between the semiconductor substrate and the control electrode dielectric layer, wherein the first region has an atomic silicon to oxygen ratio substantially equal to ½;

a second region positioned adjacent to a surface of the control electrode dielectric layer, wherein the second region has an atomic silicon to oxygen ratio larger than ½, and wherein an atomic silicon to oxygen ratio in the control electrode dielectric layer gradually decreases from the second region towards the first region, from a value greater than ½ to a value substantially equal to ½; and a third region with an atomic silicon to oxygen ratio substantially equal to ½.

17. A semiconductor device according to claim 16, wherein the semiconductor substrate comprises silicon.

18. A semiconductor device according to claim 16, wherein the semiconductor device comprises a transistor device.

19. A semiconductor device according to claim 16, wherein the silicon-oxy-nitride layer is situated in the second region.

* * * * *